United States Patent [19]

Yerman

[11] 3,909,332

[45] Sept. 30, 1975

[54] BONDING PROCESS FOR DIELECTRIC ISOLATION OF SINGLE CRYSTAL SEMICONDUCTOR STRUCTURES

[75] Inventor: Alexander J. Yerman, Scotia, N.Y.

[73] Assignee: General Electric Company, Schenectady, N.Y.

[22] Filed: June 4, 1973

[21] Appl. No.: 366,380

[52] U.S. Cl. .................... 156/309; 65/43; 156/310; 156/325; 427/255; 428/428

[51] Int. Cl.$^2$. C09J 5/00; C03C 27/00; B32B 17/06

[58] Field of Search ............ 65/43; 117/106 A, 125, 117/215, 229; 156/309, 310, 325, 89; 161/193; 317/234 E, 234 F, 235 D, 235 F, 235 AY

[56] References Cited

UNITED STATES PATENTS

| | | | |
|---|---|---|---|
| 2,620,598 | 12/1952 | Jobling-Purser et al | 317/234 F |
| 3,235,428 | 2/1966 | Naymik | 156/89 |
| 3,375,416 | 3/1968 | Adams et al. | 317/234 F |
| 3,414,465 | 12/1968 | Baak et al. | 161/193 |
| 3,577,044 | 5/1971 | Armstrong et al. | 317/235 F |
| 3,620,833 | 11/1971 | Gleim et al. | 117/212 |
| 3,661,676 | 5/1972 | Wong et al. | 156/304 |
| 3,695,956 | 10/1972 | Speers | 156/11 |

*Primary Examiner*—Charles E. Van Horn
*Assistant Examiner*—Robert A. Dawson
*Attorney, Agent, or Firm*—Donald R. Campbell; Joseph T. Cohen; Jerome C. Squillaro

[57] ABSTRACT

Single crystal silicon structures are bonded to a dielectrically isolated single crystal silicon substrate for high temperature applications where junction isolation is ineffective. One or both single crystal silicon structures are provided with a thin silicon dioxide insulating layer and a thicker deposited boric oxide-silicon dioxide glass bonding layer. Bonding at an elevated temperature under pressure is at a sufficiently low temperature that there is no effect on silica or the previously fabricated components. The process is suitable for other semiconductors and glass compositions.

3 Claims, 6 Drawing Figures

BONDING PROCESS FOR DIELECTRIC ISOLATION OF SINGLE CRYSTAL SEMICONDUCTOR STRUCTURES

BACKGROUND OF THE INVENTION

This invention relates to a bonding process for semiconductor structures, and more particularly to a bonding process for achieving dielectric isolation of single crystal silicon structures for high temperature or high radiation environment applications.

In most currently employed processes for the dielectric isolation of solid-state components, polycrystalline silicon is grown on an oxidized single crystal silicon wafer to serve as the final substrate for isolated areas of components formed from the single crystal silicon. This approach has distinct disadvantages for most solid-state components and integrated circuits because of the inferior mechanical properties of the polycrystalline silicon and differences in expansion coefficient between it and the single crystal silicon structure. What is needed is a technique for providing the original single crystal silicon, from which the components will be made, with a dielectrically isolated single crystal silicon substrate. An essential prerequisite to realizing such semiconductor structures is a bonding process that takes place at a sufficiently low temperature so as to have no effect on the silicon dioxide insulating layer and previously fabricated single crystal structure. These dielectrically isolated single crystal silicon components are useful for applications in high temperature environments, and also high radiation environments, where ordinary junction isolation is ineffective because of the high level of leakage currents.

SUMMARY OF THE INVENTION

In accordance with the preferred embodiment of the invention, a single crystal silicon structure is bonded to a dielectrically isolated single crystal silicon substrate or structure using an acceptor impurity enriched glass bonding layer that has a predetermined softening temperature, when bonded at an elevated temperature under pressure, that is substantially lower than the comparable temperature of silica and silicon. Further, the acceptor impurity enriched glass bonding layer, such as glasses containing boric oxide or aluminum oxide, has a composition with a thermal expansion coefficient that preferably approximately matches the thermal expansion coefficient of silicon.

In a typical bonding process the single crystal silicon structures are of opposite conductivity type. A silicon dioxide insulating layer is formed on one of the single crystal silicon structures, and a glass layer consisting essentially in mole percent of 15–20 percent $B_2O_3$ and 85–80 percent $SiO_2$ is chemically vapor deposited on the oxide layer or on the other silicon structure to a thickness of between 0.5 micron and 5 microns. The prepared silicon structures are bonded together at the predetermined temperature under controlled pressure, for example, in a furnace using a press, for a preselected time interval. Typical processing conditions are 850°C at 400 psi for about 1 hour. Modifications of this process are that the silicon dioxide insulating layer and glass bonding layer can be on one or both of the single crystal silicon structures. Moreover, the bonding process can be practiced with other semiconductors and glass compositions. The resulting single crystal silicon structure on a dielectrically isolated single crystal silicon substrate is advantageous for high temperature applications or high radiation environments where p-n junction isolation is useless.

DESCRIPTION OF THE PREFERRED EMBODIMENTS

Figure 1:
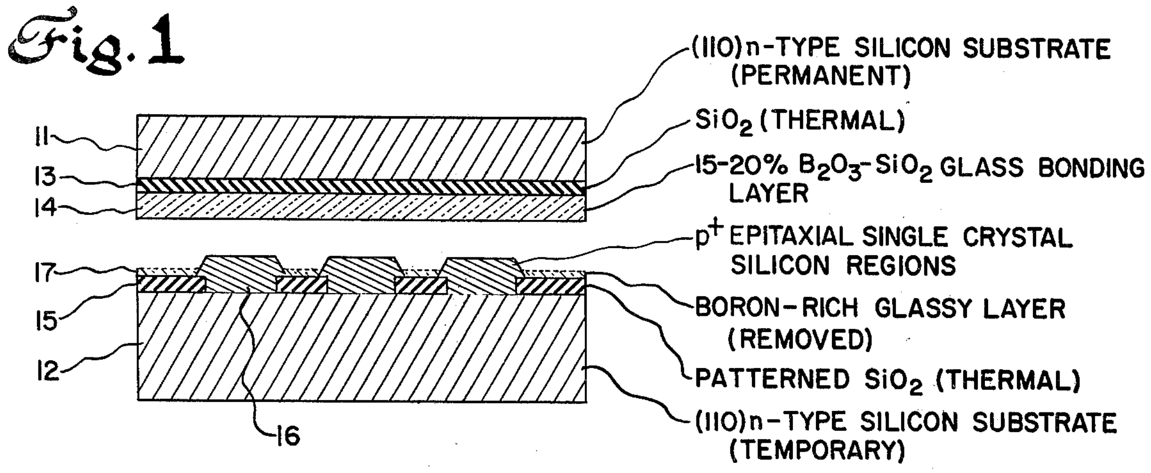
FIG. 1 is a diagrammatic cross-sectional view of a temporary single crystal silicon substrate with a fabricated single crystal silicon component, in condition to be bonded to a final single crystal silicon substrate prepared with a boric oxide-silicon dioxide glass bonding layer.
Figure 2:
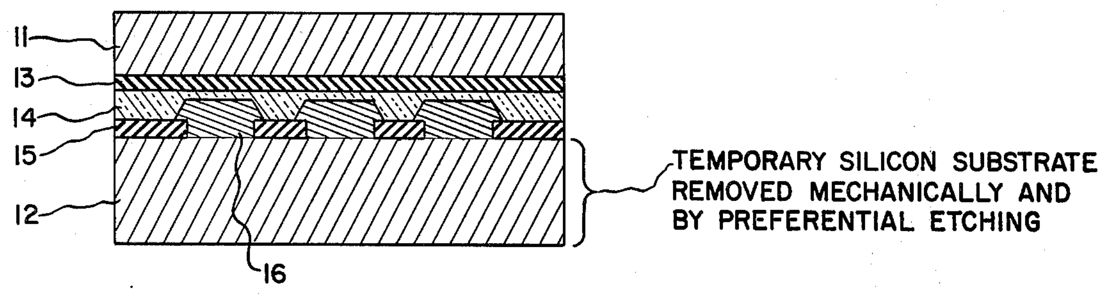
FIG. 2 shows the single crystal silicon structure after bonding at an elevated temperature under pressure.
Figure 3:
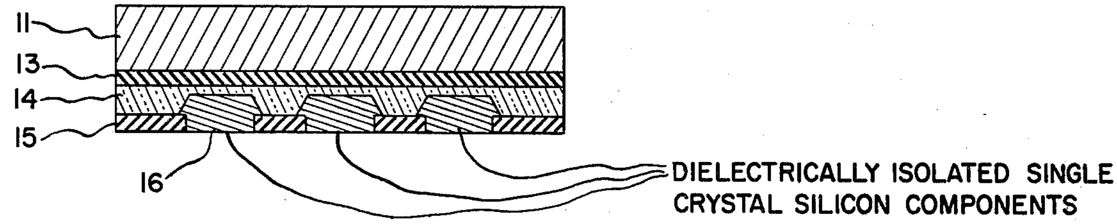
FIG. 3 shows the final single crystal silicon substrate with dielectrically isolated single crystal silicon components, obtained by removal of the temporary substrate.

The bonding process for joining a single crystal semiconductor structure to another dielectrically isolated single crystal semiconductor structure is illustrated in FIGS. 1–3 with regard to the fabrication of dielectrically isolated integral silicon strain gage structures. In principle, the bonding technique is suitable for semiconductor materials other than silicon, and for the fabrication of a variety of dielectrically isolated solid state components such as integral silicon diaphragms, monolithic integrated circuits, hybrid integrated circuits, power semiconductors, etc. The complete method of making such single crystal semiconductor structures with dielectrically isolated solid state components, and the semiconductor structures or products per se, are disclosed in the inventor's concurrently filed application, Ser. No. 366,379, assigned to the same assignee, now abandoned in view of continuation application Ser. No. 527,550 filed Nov. 27, 1974.

In practicing the method, a pair of single crystal silicon wafers 11 and 12 are provided, one of which becomes the permanent substrate while the other is a temporary substrate used to fabricate the silicon strain gage elements. Both wafers are polished flat on one face, and have a typical thickness of about 8 mils. For application as an integral silicon diaphragm substrate, semiconductor wafers 11 and 12 are preferably formed from (110) plane n-type material. Although certain steps in the subsequent processing of wafers 11 and 12 may be performed together, for the sake of clarity the processing of each wafer is discussed separately.

Figure 4:
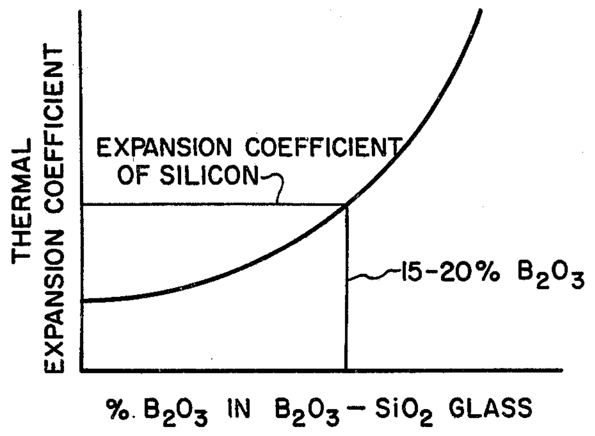
FIG. 4 is a plot of the thermal expansion coefficient of boric oxide-silicon dioxide glass with respect to the percent boric oxide in the glass.
Figure 5:
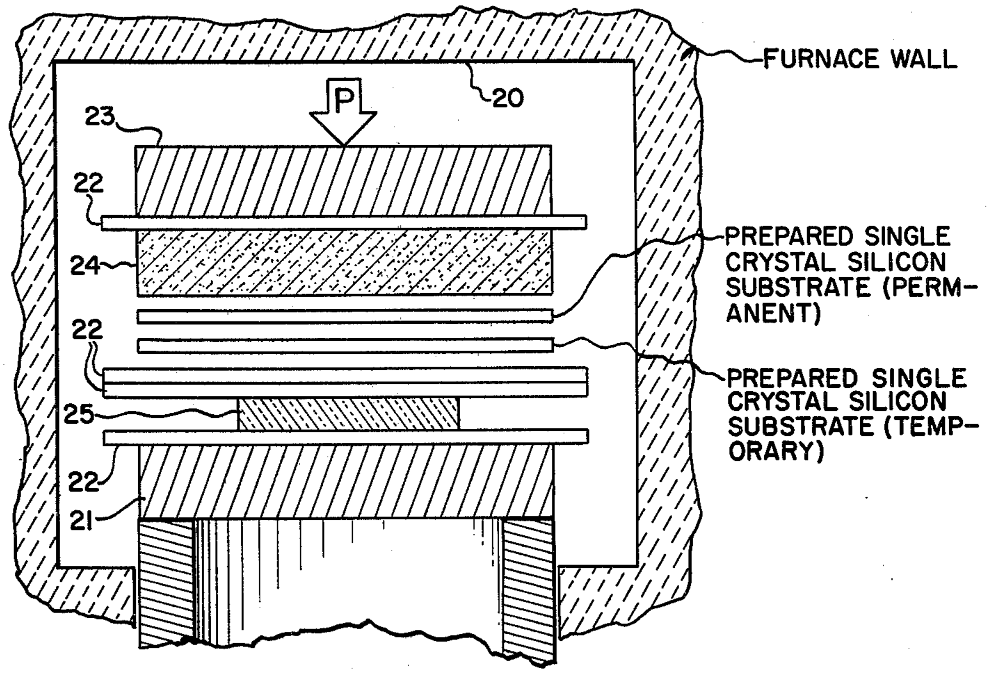
FIG. 5 is a schematic elevational view of an assemblage of lay-ups in a press mounted within a furnace for bonding the prepared single crystal silicon substrates at a preselected pressure and high temperature.

To prepare the permanent silicon substrate 11 for the bonding process, an insulating layer 13 of silicon dioxide is grown or deposited on the polished flat surface, as by exposure to steam at approximately 1,200°C or by the use of some other standard process. In accordance with the invention, a glass bonding layer 14 is deposited on the insulating silicon dioxide layer 13 for the purpose of facilitating bonding to another single crystal silicon surface that is formed on the temporary substrate 12. Preferably, glass bonding layer 14 is a thick layer of 15–20 mole percent boric oxide ($B_2O_3$)-silicon dioxide ($SiO_2$) glass having approximately the same coefficient of expansion as silicon. Referring to FIG. 4 in which the thermal expansion coefficient in conventional units is plotted against the percent $B_2O_3$ in $B_2O_3$-$SiO_2$ glass, it is seen that the expansion coefficient of silicon is matched when the glass composition includes 15–20 percent $B_2O_3$. Usually the glass bonding layer 14 is relatively thick, greater than 0.5 micron and up to 5 microns, while the silicon dioxide insulating layer 13 is usually relatively thin, typically about 1 micron. The desirable characteristic of the glass bonding layer, in addition to its relative thickness and matched thermal expansion coefficient, is that the softening temperature at which it flows under controlled loading, using a bonding apparatus or press such as is shown in FIG. 5, is substantially lower than the comparable temperature for silicon dioxide and silicon. The increase in boron concentration in the glass lowers its softening point. For example, the softening point for this particular glass composition at which the bonding process can take place is 850°C whereas the comparable temperature for silica is 1,600°C. Thus, the bonding of one single silicon structure with another dielectrically isolated single crystal silicon structure under pressure at elevated temperature takes place at a sufficiently low temperature so as to have no effect on either structure and the previously fabricated single crystal silicon component.

The boric oxide-silicon dioxide glass film or layer is suitably formed by the low temperature oxidation of silane ($SiH_4$) and diborane ($B_2H_6$) with $O_2$. This can be described briefly as a chemical vapor deposition from a gas mixture containing silane, diborane, and oxygen to form a glassy deposit on a silicon wafer maintained at 300°–500°C. The processing is performed in a quartz reactor, and it is desirable, in adition to using a low deposition temperature, to dilute the oxygen and the silane/diborane mixture with an argon buffer gas before introducing these mixtures into the reactor. The borosilicate glass produced and other information as to the process conditions and apparatus are given in the article "Glass Source B Diffusion in Si and $SiO_2$" by D. M. Brown and P. R. Kennicott, *Journal of the Electrochemical Society*, Vol. 118, No. 2, pp. 293–300 (Feb. 1971). A different method for formation of the boric oxide-silicon dioxide glassy layer, which is also satisfactory, is by exposure of the oxidized wafer in a boron diffusion furnace at elevated temperature.

As the next step in the preparation of temporary silicon substrate 12, the flat polished surface of the wafer is provided with a deposited or thermally grown insulating silicon dioxide layer 15. This thin insulating layer is patterned using conventional photo-masking and etching techniques to expose the surface of the underlying silicon substrate 12 in a selected pattern corresponding to the geometry of the single crystal strain gages or other components to be fabricated. Suitable patterns for integral silicon diaphragms are illustrated and described in detail, for example, in the inventor's U.S. Pat. No. 3,537,319 granted Nov. 3, 1970, and in U.S. Pat. No. 3,697,918, granted Oct. 10, 1972 to the inventor and E. D. Orth, both assigned to the same assignee as this invention. Strain gage elements as there shown comprise a continuous thin strip of silicon reverse bent back upon itself in accordian fashion, so that the showing in FIGS. 1–3 can be considered to be diagrammatic.

The p-type strain gage elements 16 are deposited or grown on the bare n-type silicon using the silicon dioxide layer 15 as a mask. Preferably, the opposite conductivity type regions 16 are $p^+$ epitaxially grown regions fabricated by techniques well known in the art. For example, the iodine-epitaxy process can be employed with conditions adjusted to favor formation of smooth deposits where silicon is exposed and minimal spurious deposition on the oxide layer. A boron doped source is employed having a resistivity of approximately 0.0007 ohm-centimeter so that the grown silicon layer has a boron concentration of approximately $1 \times 10^{20}$. Deposit thickness can be varied in the range of 0.2 to 4.0 microns to obtain the desired resistance of the strain gage elements that are formed. With an oxide thickness of 1 micron, a preferred minimum thickness is 1.5 microns so that the surface level of the p-type silicon elements is somewhat above the oxide surface as shown in FIG. 1. Alternatively (not here illustrated) the p-type regions can be formed on or in the exposed patterned surface of silicon substrate 12 by a standard diffusion process. The diffusion at elevated temperatures may create a very thin boron-rich glassy layer on the surface of oxide layer 15, indicated by dashed lines at 17. This unwanted glassy layer commonly has a thickness of less than 1 micron and is removed, if it is formed as just described or as a by-product of some other semiconductor processing step. Except for planar surfaces, such a very thin boron-rich glassy layer is much too thin to be used as a glass bonding layer as herein described since it limits the flatness of the surface bonded. Also, because of its high $B_2O_3$ content and consequent high expansion coefficient, crazing frequently results on cooling which weakens the bond achievable between the two silicon wafers. If the p-type regions are formed by diffusion, it is then necessary to strip the silicon dioxide diffusion mask from the silicon before bonding in order to form a planar surface or alternatively strip the oxide and preferentially etch the silicon to form p-type mesa regions slightly elevated above the remainder of the surface. Failure to do this can cause gas entrapment and consequently imperfect bonding.

Referring to FIG. 2, the prepared permanent silicon substrate 11 with the oxide layer 13 and glass bonding layer 14, and the prepared temporary silicon substrate 12 with the patterned oxide layer 15 and single crystal silicon strain gage elements 16, are bonded together at elevated temperature under controlled pressure conditions using a press of the type shown in FIG. 5. During the bonding operation the boric oxide-silicon dioxide glass layer 14 softens and flows around the somewhat higher epitaxially grown p-type regions 16 into contact with the surface of the oxide layer 15. A good, permanent bond is formed between the glass layer 14, which hardens when the temperature is reduced, and the surface of the individual single crystal silicon strain gage regions 16. The temporary silicon substrate 12 is now removed mechanically and by preferential etching. After lapping and chemically polishing, the remaining thickness of about 12 microns is removed using a preferential etchant consisting of 16 ml $H_2O$, 34 ml ethylene diamine, and 6 gm pyrocatechol. The processing steps are described in another concurrently filed patent application by the inventor, Ser. No. 366,377, now abandoned and for general information on the preferential etchant the reader is referred to the article "A Water-Amine-Complexing Agent System for Etching Silicon" by R. M. Finne and D. L. Klein, *Journal of the Electrochemical Society*, Vol. 114, No. 9, pp. 965–970 (September 1967). After the removal of the temporary silicon substrate, the resulting semiconductor structure shown in FIG. 3 is, when turned right-side up, an integral silicon diaphragm with dielectrically isolated single crystal silicon strain gage elements or components. This semiconductor structure has good mechanical properties, has matched thermal expansion coefficients for the main constituent parts, and is suitable for application at temperatures considerably higher than the 250°F limit of junction isolated structures. It is also serviceable in high radiation environments.

One type of furnace and press apparatus that can be used for the practice of the bonding process under pressure at elevated temperatures is illustrated schematically in FIG. 5. Within a tubular furnace, the walls of which are illustrated diagrammatically at 20, is mounted a stainless steel support 21 for supporting the assemblage of lay-ups that are used in the press. A number of thin sheets of mica 22 are employed as a lubricant in the press and to catch the flowing or dripping molten glass. Starting at the top, the assemblage includes an upper stainless steel support 23, a mica sheet 22, and a quartz flat 24. Next, the prepared single crystal silicon permanent substrate (elements 11, 13, and 14) and the prepared single crystal temporary substrate (elements 12, 15, and 16). Below the two prepared silicon substrates to be joined are a pair of mica sheets 22, a glass compliant layer 25, and a final mica sheet 22. The softening point of the glass compliant layer 25 under pressure is about 700°C, lower than that of the boric oxide-silicon dioxide glass bonding layer 14. It not only flows under pressure but is thicker than layer 14 so that it can flow more. A suitable pressure-applying mechanism, not here illustrated, applies a controlled and preselected pressure to the upper stainless steel support 23.

A typical set of operating conditions that produces a good bond of one single crystal silicon structure to another when prepared as herein described is to maintain the assembly at 900°C for about 1 hour. The average pressure across the prepared substrates is approximately 400 psi. In general, the temperature required depends on the composition of the glass bonding layer and the pressure level and time applied. It usually exceeds 650°C for several hundred psi applied for at least one-half hour. Since it is important that the silicon be maintained flat to insure uniform bonding, the wafers or prepared substrates are pressed between fused quartz flats, or alternatively as is here illustrated, where compliance is advantageous another material such as the glass layer 25 or a metal layer may be included in the lay-up together with one quartz flat. As was previously mentioned, the softening point of the particular boric oxide-silicon dioxide glass insulating layer 14 that is used in the preferred embodiment is 850°C. When heated and softened to this degree, as is recognized by those skilled in the glass fabricating arts, the glass flows under controlled loading, although it is not sufficiently soft to flow by gravity. Under these controlled conditions of pressure and temperature, the glass bonding layer flows into contact with the uneven or contoured surface of the prepared temporary substrate 12, forming a good bond to both the single crystal regions or strain gage elements 16 and the surrounding silicon dioxide insulating layer 15. Since the glass bonding layer 14 is relatively thick, preferably about 2–3 microns, perfect flatness of the different surfaces that are joined is not required.

Figure 6:
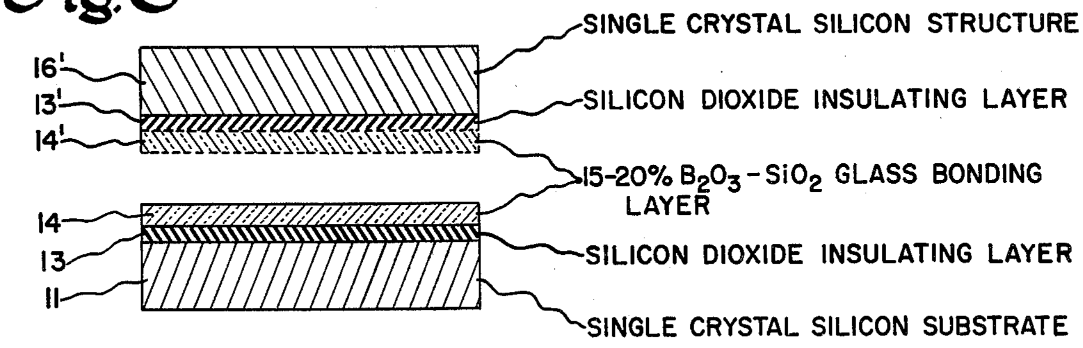
FIG. 6 illustrates some of the modifications of the single crystal structures suitable for bonding, specifically that one or both substrates can have the silicon dioxide insulating layer and boric oxide-silicon dioxide glass bonding layer.

FIG. 6 illustrates some of the modifications of the single crystal semiconductor bonding process that may be suitable for certain single crystal semiconductor structures and for certain applications. The preferred embodiment has been discussed with regard to the n-type single crystal silicon substrate 11 provided with the silicon dioxide insulating layer 13 and the relatively thick boric oxidesilicon dioxide glass bonding layer 14 with added boron to lower the softening point. This structure is bonded to the p-type single crystal silicon structure 16' having boron as the acceptor impurity. As modifications to this preferred method, either one or both of the single crystal silicon structures being joined can be either n- or p-type and can have a silicon dioxide insulating layer and a boric oxide-silicon dioxide glass bonding layer. Thus, within the broader scope of the invention, the n- or p-type structure 16' can have a silicon dioxide insulating layer 13' or can have both the insulating layer 13' and a boric oxide-silicon dioxide glass bonding layer 14'. Of course, the structure 16' with the layers 13' and 14' can be bonded to the substrate 11, or the substrate 11 having the oxide layer 13, or both the oxide layer 13 and the glass bonding layer 14. Moreover, the glass bonding layer can be formed directly on bare silicon while the silicon dioxide insulating layer is on the other silicon member. The invention can also be practiced with an aluminumenriched glass bonding layer that is bonded to an n- or p-type single crystal silicon structure having aluminum as the acceptor impurity. The various modifications to the method as just discussed can also be employed. Further, the bonding process is applicable to appropriate semiconductors other than silicon.

Another modification of the basic bonding process for single crystal semiconductor structures is the following. By varying the relative thickness of the thermal silicon dioxide insulating layers and the boric oxide-rich glass bonding layer, it is possible to "heat cure" the bond region for use at temperatures above the bond temperature. When the glass bonding layer is made thin compared to the other silicon dioxide insulating layers, after bonding the borid oxide tends to distribute or migrate throughout the entire silicon dioxide layer thickness. This reduces the boric oxide concentration as the boron tends to migrate after the glass bonding layer is made, thereby raising the softening point of the glass bonding layer. The boric oxide-silicon dioxide glass bonding layer in this case is less than one micron in thickness. By raising the softening point of the glass in this manner, bond integrity is maintained at the temperatures of 1,000°–1,200°C which are usually encountered in subsequent processing steps to form the silicon strain gage elements or other single crystal semiconductor structures and components.

In summary, a bonding process for bonding one single crystal semiconductor to another uses a boron or aluminum oxide enriched glass bonding layer with a lowered softening point under controlled pressure. By properly selecting the glass composition, the thermal expansion coefficient of the semiconductor is matched. An application is dielectrically isolated single crystal silicon structures for high temperature or high radiation environments where junction isolation is ineffective.

While the invention has been particularly shown and described with reference to several preferred embodiments thereof, it will be understood by those skilled in the art that the foregoing and other changes in form and details may be made therein without departing from the spirit and scope of the invention.

What I claim as new and desire to secure by Letters Patent of the United States is:

1. A bonding process for dielectrically isolated single crystal silicon structures comprising the steps of providing first and second single crystal silicon structures, forming a silicon dioxide insulating layer on at least one of said silicon structures, chemically depositing on at least one of said silicon structures as so prepared a glass bonding layer consisting essentially in mole percent of 15–20 percent boric oxide and 80–85 percent silicon dioxide and having a thermal expansion coefficient that approximately matches the thermal expansion coefficient of silicon, and bonding together said single crystal silicon structures with at least one intermediate silicon dioxide layer and glass bonding layer at a temperature not exceeding about 900°C and at least as high as the softening temperature of said glass bonding layer under a controlled pressure of several hundred psi and for a time interval of about one-half hour to 1 hour to thereby cause flow of said glass bonding layer under the controlled pressure.

2. A bonding process according to claim 1 wherein said deposited glass bonding layer has a thickness between 0.5 and 5 microns.

3. A bonding process according to claim 1 wherein said glass bonding layer is chemically vapor deposited by the low temperature oxidation of silane and diborane with oxygen.

* * * * *